United States Patent
Lee

(10) Patent No.: US 8,692,108 B2
(45) Date of Patent: Apr. 8, 2014

(54) SOLAR POWER COLLECTING DEVICE

(75) Inventor: Tsung-Xian Lee, Hsinchu (TW)

(73) Assignee: EPISTAR Corporation, Hsinchu (TW)

( * ) Notice: Subject to any disclaimer, the term of this patent is extended or adjusted under 35 U.S.C. 154(b) by 730 days.

(21) Appl. No.: 12/982,332

(22) Filed: Dec. 30, 2010

(65) Prior Publication Data

US 2011/0155216 A1     Jun. 30, 2011

(30) Foreign Application Priority Data

Dec. 30, 2009    (TW) ............................... 98146161 A

(51) Int. Cl.
*H01L 31/052*     (2014.01)
*G02B 6/42*     (2006.01)

(52) U.S. Cl.
CPC ............. *H01L 31/0525* (2013.01); *G02B 6/42* (2013.01)
USPC ............................ 136/246; 136/245; 136/259

(58) Field of Classification Search
CPC .............................. H01L 31/0525; G02B 6/42
USPC ........................................ 136/245, 246, 259
See application file for complete search history.

(56) References Cited

U.S. PATENT DOCUMENTS

| | | | |
|---|---|---|---|
| 2004/0187908 A1* | 9/2004 | Muhs et al. | 136/246 |
| 2009/0114265 A1* | 5/2009 | Milbourne et al. | 136/246 |
| 2009/0288656 A1* | 11/2009 | Lin | 126/574 |
| 2010/0252085 A1* | 10/2010 | Gotthold et al. | 136/206 |

* cited by examiner

*Primary Examiner* — Jonathan Johnson
*Assistant Examiner* — Allison Bourke
(74) *Attorney, Agent, or Firm* — Muncy, Geissler, Olds & Lowe, P.C.

(57) ABSTRACT

A solar power collecting device including a parabolic concentrating unit, a light-guide pillar positioned on the parabolic concentrating unit, a solar cell positioned on the light-guide pillar and a transmissive protection cap for covering the light-guide pillar and the solar cell is disclosed.

12 Claims, 1 Drawing Sheet

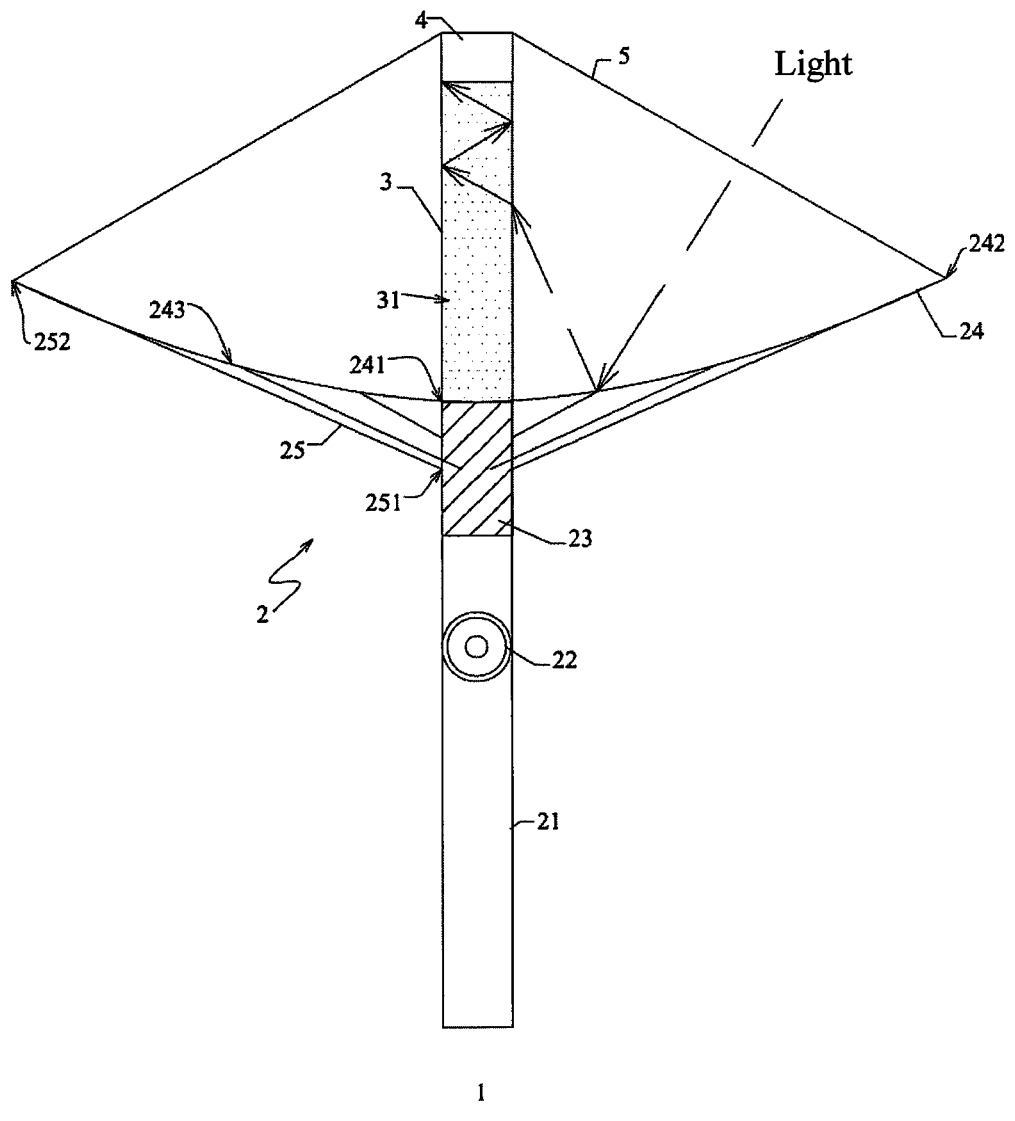

SOLAR POWER COLLECTING DEVICE

REFERENCE TO RELATED APPLICATION

This application claims the right of priority based on Taiwan application Ser. No. 098146161, filed on Dec. 30, 2009, the entirety of which is incorporated by reference herein.

TECHNICAL FIELD

The present application relates to a solar power collecting device, and more specifically, to a foldable solar power collecting device.

BACKGROUND

In recent years, energy shortage has attracted people's attention on the importance of saving energy and environmental protection. Thus, many researches focus on alternative energy and renewable energy. Solar power is found to be one of the competitive alternatives for conventional energy. The main reason is that solar cell can convert sun light into electricity without generating any polluting gas such as carbon dioxide ($CO_2$) and can ease the phenomenon of global warming problem.

In order to improve the efficiency of solar cells, one way is to increase the illumination area of solar cells. A parabolic type concentrator having a solar cell positioned at its focus point is introduced. The parabolic type concentrator has a parabolic mirror which can focus axial collimated sun rays to its focus point. Therefore, the solar cells positioned at the focus point can receive as much sun rays as it is exposed to. However, the parabolic type concentrator requires large space and is complicated to be set up. Hence, the application of such parabolic type concentrator is limited.

SUMMARY OF THE DISCLOSURE

According to one embodiment of the present application, a solar power collecting device includes a supporting stem, a slidable housing installed on and able to slide along with the supporting stem, a plurality of supporting arms which a first end of each of the plurality of supporting arms is rotably connected to the slidable housing, a specular member connected to the supporting stem and a second end of each of the plurality of supporting arms, and a light-guide pillar positioned on the supporting stem, wherein the specular member can be extended and folded with a sliding of the slidable housing and corresponding movement of the supporting arms.

BRIEF DESCRIPTION OF THE DRAWINGS

FIG. 1 is a schematic view of a preferred embodiment of the present application.

DETAILED DESCRIPTION OF THE PREFERRED EMBODIMENTS

Throughout the following description, similar reference numerals refer to similar elements in all figures of the drawings.

Referring to FIG. 1, a solar power collecting device according to a preferred embodiment of the present application is illustrated. According to the preferred embodiment, the solar power collecting device 1 includes a parabolic concentrating unit 2, a light-guide pillar 3 positioned on the parabolic concentrating unit 2, a solar cell 4 positioned on the top portion of the light-guide pillar 3, and a transmissive protection cap 5, for covering the light-guide pillar 3 and the solar cell 4.

The parabolic concentrating unit 2 includes a supporting stem 21 which has a rotable bearing 22 installed thereon, a slidable housing 23 installed on the supporting stem 21, a specular member 24, and a plurality of supporting arms 25. The specular member 24 has a central portion 241 and a fringe portion 242. The central portion 241 of the specular member 24 is rotably connected to the slidable housing 23 or fixed to the supporting stem 21. Each of the supporting arms 25 has a first end 251 and a second end 252, wherein the first end 251 is rotably connected with the slidable housing 23 and the second end 252 is rotably connected with the fringe portion 242 of the specular member 24.

The supporting stem 21 also includes a storage battery (not shown) connected with the solar cell 4 for storing the electricity converted from the solar cell 4. The rotable bearing 22 can move the supporting stem 21 in two-dimension in response to sun light. The slidable housing 23 is installed on and can slide along with the supporting stem 21. With the sliding of the slidable housing 23 and relative movement of the supporting arms 25, the specular member 24 can be extended and folded. Thus, the solar power collecting device 1 is easy to store and portable when the specular member 24 moves to its folded position. Therefore, the set up of the solar power collecting device 1 is flexible.

The specular member 24 has a specular surface 243 arranged on one side opposing to the solar cell 4. As shown in FIG. 1, the unfolded specular member 24 is a parabolic mirror. The specular member 24 can be made by coating a flexible substrate with reflective materials. For example, the flexible substrate can be cloth, plastic, polymer or metal foil. The reflective material can be copper, aluminum, gold, platinum, silver, titanium, nickel, or chromium.

As shown in FIG. 1, the light-guide pillar 3 is disposed on the supporting stem 21 for guiding light toward the solar cell 4 thereon.

The light-guide pillar 3 can be cylinder, column, compound parabolic concentrator (CPC), compound elliptic concentrator (CEC) or compound hyperbolic concentrator (CHC). The light-guide pillar 3 can be made solid or hollow. The light-guide pillar 3 is light-transmissive and can be made of inorganic or organic materials, such as diamond, glass, quartz, acryl, zinc oxide (ZnO), aluminium nitride (AlN), plastic, polyimide, benzocyclobutene (BCB), perfluorocyclobutane (PFCB), dielectric, photoresist (Su8), epoxy, acrylic resin, cyclo-olefin copolymer (COC), polymethylmethacrylate (PMMA), polyethylene terephthalate (PET), polycarbonate (PC), polyetherimide, fluorocarbon polymer, high-density polyethylene (HDPE), polyvinylchloride (PVC), low-density polyethylene (LDPE), polypropylene (PP), polystyrene (PS), silicone, aluminum oxide ($Al_2O_3$), silicon oxide($SiO_2$), titanium oxide ($TiO_2$), silicon nitride (SiNx) or spin-on glass (SOG).

Besides, the light-guide pillar 3 can further include a plurality of scattering particles 31. The scattering particles 31 are distributed inside the light-guide pillar 3 for scattering light. The scattering particles 31 can be silicon oxide ($SiO_2$), titanium oxide ($TiO_2$) or aluminum oxide ($Al_2O_3$).

The solar cell 4 is located on the light-guide pillar 3 and is positioned at the focus point of the specular member 24 for receiving and converting light into electric current. The solar cell 4 can be III-V compound solar cell, silicon solar cell, multi-junction solar cell or single-junction solar cell. As shown in FIG. 1, the transmissive protection cap 5 covers the solar cell 4, the light-guide pillar 3 and the specular surface 243 of the specular member 24 for prevention of dust contamination and moisture damp. Therefore, the lift span of the solar power collecting device 1 can be extended. The transmissive protection cap 5 can be made of plastic or polymer materials.

The various embodiments that have been illustrated and/or described are only examples and, therefore, are non-limitive. It is to be understood that many changes in the particular structure, materials and features may be made without departing from the spirit and scope of the present disclosure. Therefore, it is our intention that the patent rights not be limited to the particular embodiments that are illustrated and described herein, but rather are to be determined by the following claims, interpreted according to accepted doctrines of patent claim interpretation, including use of the doctrine of equivalents.

What is claimed is:

1. A solar power collecting device, comprising:
   a supporting stem;
   a slidable housing installed on and able to slide along with the supporting stem;
   a plurality of supporting arms, wherein a first end of each of the plurality of supporting arms is rotably connected to the slidable housing;
   a parabolic specular member connected to the supporting stem and a second end of each of the plurality of supporting arms
   a light-guide pillar positioned on the supporting stem and in contact with the supporting stem; and
   a solar cell positioned on the light-guide pillar.

2. The solar power collecting device as claimed in claim 1, wherein the supporting stem further includes a storage battery.

3. The solar power collecting device as claimed in claim 1, wherein the supporting stem further includes a rotable bearing.

4. The solar power collecting device as claimed in claim 1, wherein the parabolic specular member includes one or more materials selected from the group consisting of cloth, plastic, polymer and metal foil.

5. The solar power collecting device as claimed in claim 1, wherein the parabolic specular member includes one or more materials selected from the group consisting of copper, aluminum, gold, platinum, silver, titanium, nickel, and chromium.

6. The solar power collecting device as claimed in claim 1, wherein the light-guide pillar includes one or more material selected from the group consisting of diamond, glass, quartz, zinc oxide (ZnO), aluminium nitride (AlN), dielectric, aluminum oxide ($Al_2O_3$), silicon oxide($SiO_2$), titanium oxide ($TiO_2$), silicon nitride (SiNx) and spin-on glass (SOG).

7. The solar power collecting device as claimed in claim 1, wherein the light-guide pillar includes one or more material selected from the group consisting of plastic, polyimide, benzocyclobutene (BCB), perfluorocyclobutane (PFCB), photoresist (Su8), epoxy, acrylic resin, cyclo-olefin copolymer (COC), polymethylmethacrylate (PMMA), polyethylene terephthalate (PET), polycarbonate (PC), polyetherimide, fluorocarbon polymer, high-density polyethylene (HDPE), polyvinylchloride (PVC), low-density polyethylene (LDPE), polypropylene (PP), polystyrene (PS) and silicone.

8. The solar power collecting device as claimed in claim 1, wherein the light-guide pillar further contains a plurality of scattering particles.

9. The solar power collecting device as claimed in claim 8, wherein the scattering particles includes one or more materials selected from the group consisting of silicon oxide ($SiO_2$), titanium oxide ($TiO_2$) and aluminum oxide ($Al_2O_3$).

10. The solar power collecting device as claimed in claim 1, wherein the solar cell is formed of III-V compound solar cell, silicon solar cell, multi-junction solar cell or single-junction solar cell.

11. The solar power collecting device as claimed in claim 1, wherein the solar power collecting device further comprises a transmissive protection cap for covering the parabolic specular member and the light-guide pillar.

12. The solar power collecting device as claimed in claim 1, wherein the light-guide pillar is made of cylinder, square column, compound parabolic concentrator (CPC), compound elliptic concentrator (CEC) or compound hyperbolic concentrator (CHC).

* * * * *